United States Patent
Numata et al.

(10) Patent No.: US 7,538,630 B2
(45) Date of Patent: May 26, 2009

(54) VOLTAGE CONTROLLED OSCILLATOR

(75) Inventors: Toshimasa Numata, Yokohama (JP); Alejandro Puel, San Jose, CA (US)

(73) Assignee: Fujitsu Media Devices Limited, Kanagawa (JP)

( * ) Notice: Subject to any disclaimer, the term of this patent is extended or adjusted under 35 U.S.C. 154(b) by 129 days.

(21) Appl. No.: 11/645,794

(22) Filed: Dec. 27, 2006

(65) Prior Publication Data

US 2008/0157892 A1  Jul. 3, 2008

(51) Int. Cl.
*H03C 3/22* (2006.01)
*H03K 3/282* (2006.01)

(52) U.S. Cl. .............................. 331/177 V; 331/117 R; 331/36 C

(58) Field of Classification Search ................ 331/36 C, 331/117 FE, 117 R, 177 V, 167
See application file for complete search history.

(56) References Cited

U.S. PATENT DOCUMENTS

| | | | | |
|---|---|---|---|---|
| 4,536,724 A | * | 8/1985 | Hasegawa et al. | 331/177 V |
| 4,593,255 A | * | 6/1986 | Matsuura | 331/117 R |
| 5,144,264 A | * | 9/1992 | Chong et al. | 331/117 R |
| 5,379,003 A | * | 1/1995 | Bizen | 331/117 R |
| 5,694,092 A | * | 12/1997 | Oba et al. | 331/117 R |

FOREIGN PATENT DOCUMENTS

| JP | 2003-188723 A | 7/2003 |
|---|---|---|
| KR | 100571638 B1 | 4/2006 |

* cited by examiner

*Primary Examiner*—Robert Pascal
*Assistant Examiner*—Levi Gannon
(74) *Attorney, Agent, or Firm*—Arent Fox LLP

(57) ABSTRACT

The present invention is an oscillator including: a first resonance circuit including a first variable capacitance diode having a cathode connected to a control terminal, a first capacitor and a first inductor connected between an anode of the first variable capacitance diode and ground; a second resonance circuit including a second variable capacitance diode having a cathode connected to the control terminal, a second capacitor and a second inductor connected between an anode of the second variable capacitance diode and ground; and an oscillation circuit coupled to the first and second resonance circuits and outputting an oscillation output.

11 Claims, 3 Drawing Sheets

US 7,538,630 B2

VOLTAGE CONTROLLED OSCILLATOR

BACKGROUND OF THE INVENTION

1. Field of the Invention

The present invention generally relates to oscillators, and more particularly, to an oscillator having at least one resonance circuit.

2. Description of the Related Art

Oscillators, particularly, voltage-controlled oscillators have been used in mobile communication equipment such as PHS (Personal Handyphone System), wireless LAN (Local Area Network), and transceivers.

The voltage-controlled oscillator includes a resonance circuit generating a resonance signal of a frequency controlled by a control voltage, and an oscillation circuit generating an oscillation signal of the resonance frequency.

FIG. 1 is a circuit diagram of a conventional oscillator. The oscillator includes an oscillation unit 11, which includes a resonance circuit 25, an oscillation circuit 30 and a buffer circuit 40. A transistor Q1 that forms the oscillation circuit 30 and a transistor Q2 that forms the buffer circuit 40 are cascaded between ground and a power supply terminal Tb.

The resonance circuit 25 includes a variable capacitance diode D1, capacitors C2 and C3 and a line S5 such as a strip line. A control voltage applied to a control terminal Ta is processed by a line S4 and a capacitor C1 so that high-frequency components of the control voltage can be removed, and is then applied to the variable capacitance diode D1. The electrostatic capacitance of the variable capacitance diode D1 is changed by the control voltage, and the changed electrostatic capacitance changes the resonance frequency of the resonance circuit 25.

The oscillation circuit forms a Clap oscillation circuit that is composed of a bipolar transistor Q1 and the capacitors C5 and C6 and is a kind of Colpitts oscillator. The base of the transistor Q1 is connected to the resonance circuit 25 via a coupling capacitor C4.

The buffer circuit 40 includes a bipolar transistor Q2. The emitter of the bipolar transistor Q2 is connected to the collector of the transistor Q1 of the oscillation circuit 30, and the base of the transistor Q2 is connected to the emitter of the transistor Q1 via a coupling capacitor C8.

A line S2 functions as a choke inductor that removes AC components when power is applied to the collector of the transistor Q2 from the power supply terminal Tb. Resistors R1 through R4 defines a bias supplied to the transistors Q1 and Q2. Capacitors C7, C10 and C11 function to short-circuit high-frequency components to ground.

The voltage-controlled oscillator is required to have reduced phase noise and an enhanced C/N (Carrier to Noise) ratio. Increased output power may enhance the C/N ratio, but may increase power consumption.

Japanese Patent Application Publication No. 2003-188723 discloses a voltage-controlled oscillator in which a control voltage is applied to the cathodes of three variable capacitance diodes.

SUMMARY OF THE INVENTION

An object of the present invention is to improve the C/N ratio with the above in mind. According to an aspect of the present invention, there is provided an oscillator including: a first resonance circuit including a first variable capacitance diode having a cathode connected to a control terminal, a first capacitor and a first inductor connected between an anode of the first variable capacitance diode and ground; a second resonance circuit including a second variable capacitance diode having a cathode connected to the control terminal, a second capacitor and a second inductor connected between an anode of the second variable capacitance diode and ground; and an oscillation circuit coupled to the first and second resonance circuits and outputting an oscillation output. With this structure, the first resonance circuit primarily defines the resonance frequency. The second resonance circuit can be used to improve the C/N ratio by adjusting the capacitance of the second capacitor and the inductance of the second inductor.

According to another aspect of the present invention, there is provided an oscillator including: a resonance circuit having a variable capacitance diode having a cathode connected to a control terminal, a first capacitor and a first inductor connected between an anode of the variable capacitance diode and ground, and a second capacitor connected between a cathode of the variable capacitance diode and ground; an oscillation circuit outputting an oscillation signal; a first coupling capacitor coupling the resonance circuit and the oscillation circuit; and a second coupling capacitor coupling the resonance circuit and the oscillation circuit. The first capacitor and the first inductor primarily define the resonance frequency. The capacitance of the second capacitor can be adjusted to improve the C/N ratio. It is thus possible to improve the C/N characteristic.

According to yet another aspect of the present invention, there is provided an oscillator including: an oscillation circuit outputting an oscillation signal of a resonance frequency; a first resonance circuit that is coupled to the oscillation circuit via a first coupling capacitor and primarily defines the resonance frequency; and a second resonance circuit that is coupled to the oscillation circuit via a second coupling capacitor and adjusts characteristics. The first resonance circuit primarily defines the resonance frequency, and the second resonance circuit adjusts the characteristics including the C/N characteristic. It is thus possible to improve characteristics including the C/N characteristic.

BRIEF DESCRIPTION OF THE DRAWINGS

Exemplary embodiments of the present invention will be described in detail with reference to the following drawings, wherein.

DESCRIPTION OF THE PREFERRED EMBODIMENTS

A description will now be given, with reference to the accompanying drawings, of exemplary embodiments of the present invention.

First Embodiment

Figure 1:
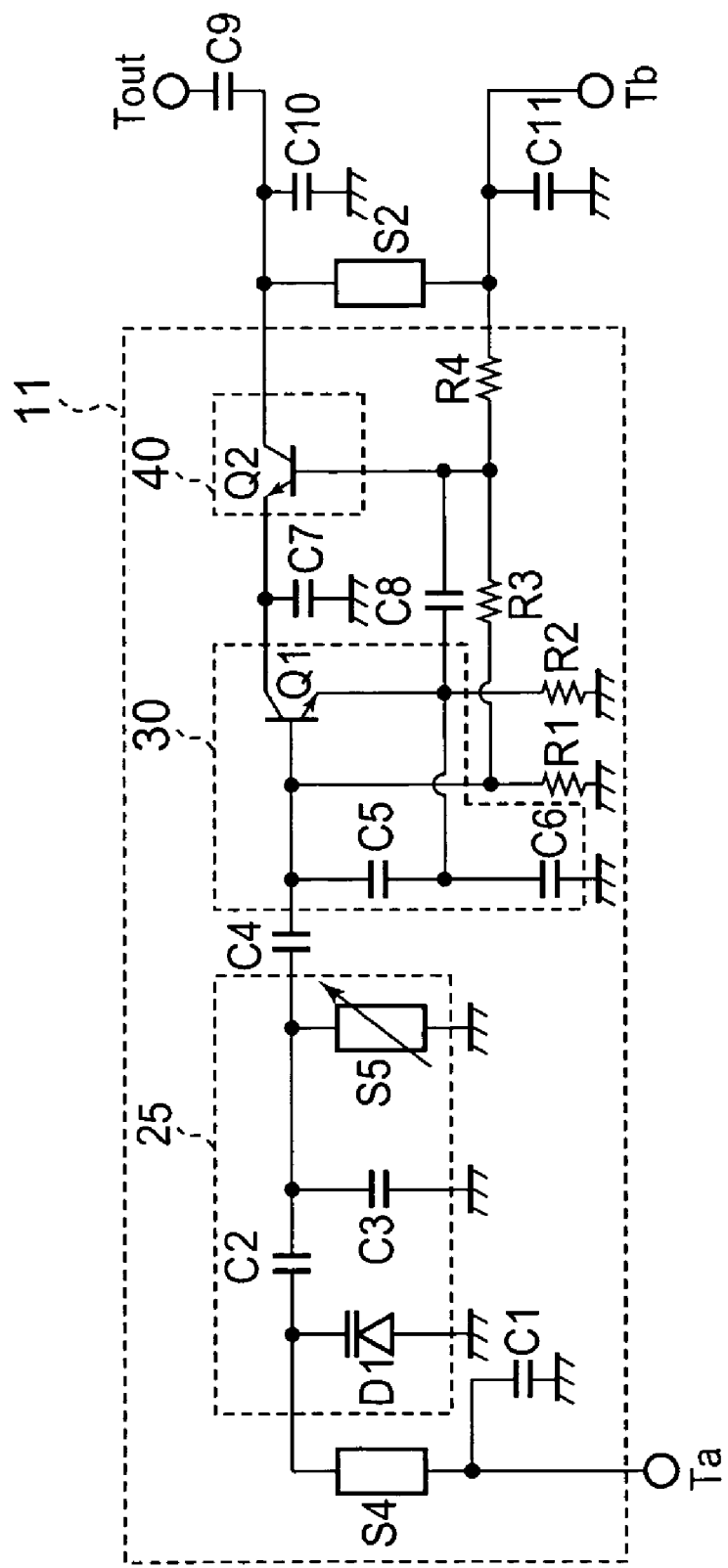
FIG. 1 is a circuit diagram of a conventional oscillator.
Figure 2:
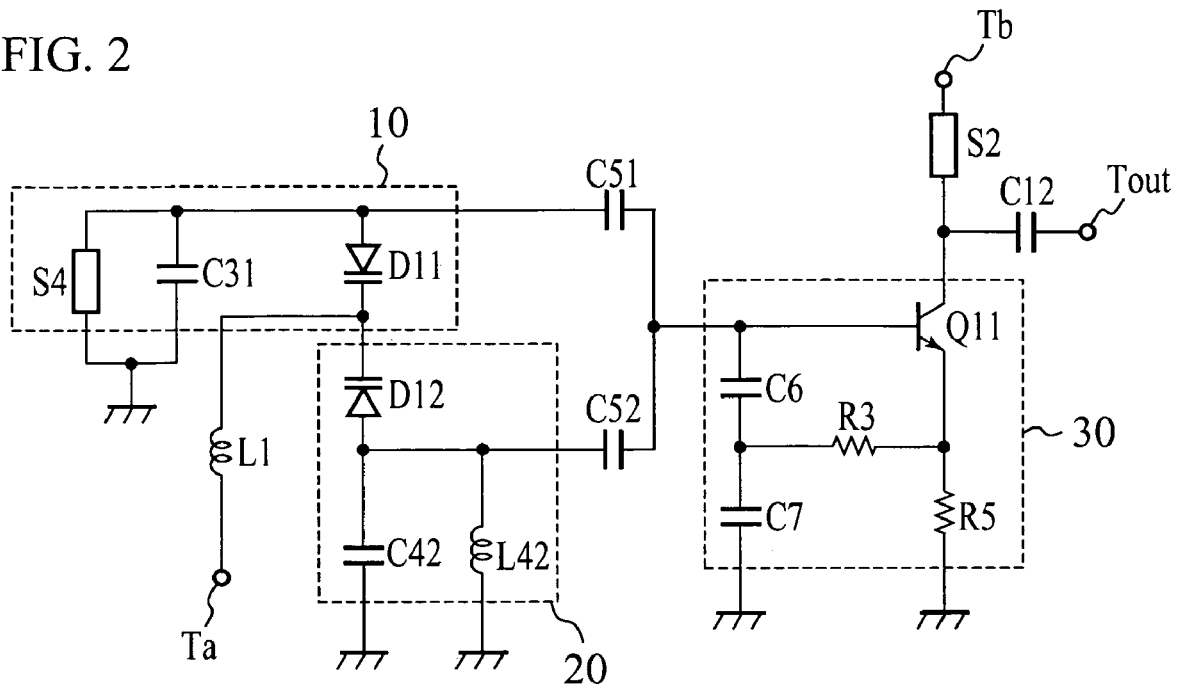
FIG. 2 is a circuit diagram of an oscillator in accordance with a first embodiment.

FIG. 2 is a circuit diagram of an oscillator in accordance with a first embodiment. Referring to FIG. 2, the oscillator includes a first resonance circuit 10, a second resonance circuit 20 and an oscillation circuit 30. The first resonance circuit 10 includes a first variable capacitance diode D11, a first capacitor C31, and a line S4 (first inductor). The cathode of the first variable capacitance diode D11 is connected to the control terminal Ta. The anode of the first variable capacitance diode D11 is grounded via the first capacitor C31 and the line S4 connected in parallel.

The second resonance circuit 20 includes a second variable capacitance diode D12, a second capacitor C42 and a second inductor L42. The cathode of the second variable capacitance diode D12 is connected to the cathode of the first variable capacitance diode D11. That is, the cathode of the second variable capacitance diode D12 is connected to the control terminal Ta via the choke inductor L1. The anode of the second variable capacitance diode D12 is grounded via the second capacitor C42 and the second inductor L42 connected in parallel.

The control voltage applied to the control terminal Ta change the capacitances of the first and second variable capacitance diodes D11 and D12 of the first and second resonance circuits 10 and 20. Thus, the resonance frequencies are changed by the control voltage.

The oscillation circuit 30 includes an NPN bipolar transistor Q11, capacitors C6 and C7, and resistors R3 and R5. The capacitors C6 and C7 are directly connected to the base of the transistor Q11, which is thus grounded. A node between the capacitors C6 and C7 is connected to the emitter of the transistor Q11 via the resistor R3. The emitter of the transistor Q11 is grounded via the emitter resistor R5. The transistor Q11 and the capacitors C6 and C7 form a Clapp circuit, which is a kind of Colpitts oscillator.

The base of the transistor Q11 and the anode of the first variable capacitance diode D1 of the first resonance circuit 10 are coupled via a first coupling capacitor C51. The base of the transistor Q11 and the anode of the second variable capacitance diode D12 of the second resonance circuit 20 are coupled via a second coupling capacitor C52. The oscillation circuit 30 with the above structure amplifies the oscillation signal of the resonance frequency defined by the first and second resonance circuits 10 and 20, and applies the amplified oscillation signal to the collector thereof.

The collector of the transistor Q11 is connected to the power supply terminal Tb via the line S2. The line S2 functions as a choke inductor for supplying a DC voltage to the collector of the transistor Q11. The collector of the transistor Q11 is connected to an output terminal Tout via a capacitor C12. The capacitor C12 has the function of cutting off the DC component and matching impedance. With the above structure, the oscillation signal of the oscillation circuit 30 is output via the output terminal Tout.

In the oscillator of the first embodiment, the first resonance circuit 10 includes the first variable capacitance diode D11 having the cathode connected to the control terminal Ta, and the parallel circuit composed of the first capacitor C31 and the line S4 and connected between the anode of the first variable capacitance diode D11 and ground. The LC resonance of the first resonance circuit 10 primarily defines the resonance frequency.

The second resonance circuit 20 includes the second variable capacitance diode D12 having the cathode connected to the control terminal Ta, and the parallel circuit composed of the second capacitor C42 and the second inductor L42 and connected between the anode of the second variable capacitance diode D12 and ground. The second resonance circuit 20 adjusts the C/N ratio and so on. The oscillation circuit 30 connected to the first and second resonance circuits 10 and 20 outputs the oscillation signal of the resonance frequency.

As described above, the resonance frequency is primarily defined by the first resonance circuit 10, and the capacitance of the second capacitor C42 and inductor of the second inductor L42 are adjusted so that the oscillator has desired characteristics. For example, these factors are adjusted so as to improve the C/N characteristic. It is thus possible to restrict phase noise.

The oscillator of the first embodiment includes the first coupling capacitor C51 for coupling the first resonance circuit 10 and the oscillation circuit 30, and the second coupling capacitor C52 for coupling the second resonance circuit 20 and the oscillation circuit 30. The first coupling capacitor C51 is connected between the anode of the first variable capacitance diode D11 and the base of the transistor Q11. The second coupling capacitor C52 is connected between the anode of the second variable capacitance diode D12 and the base of the transistor Q11. It is thus possible to couple the first and second resonance circuits 10 and 20 with the oscillation circuit 30 with different strengths of coupling.

The capacitance value of the first coupling capacitor C51 may be less than that of the second coupling capacitor C52. This weakens the coupling between the oscillation circuit 30 and first resonance circuit 10 that primarily defines the resonance frequency. It is thus possible to prevent the resonance frequency of the first resonance circuit 10 from being varied even if the temperature changes or the external impedance connected to the output terminal Tout changes. Further, the coupling between the second resonance circuit 20 and the oscillation circuit 30 is strengthened. It is thus possible to easily adjust the C/N ratio by changing the capacitance of the second capacitor C42 and the inductance of the second inductor L42. This enables the characteristics such as the C/N ratio to be adjusted at the time of designing or producing the oscillators. The capacitance of the first coupling capacitor C51 may be, for example, 1/3 of the capacitance of the second coupling capacitor C52.

Further, the capacitance of the first capacitor C31 and the inductance of the line S4 (first inductor) may be greater than the capacitance of the second capacitor C42 and the inductor of the second inductor L42, respectively. Thus, the first resonance circuit 10 can primarily define the resonance frequency. The second resonance circuit 20 can adjust the characteristics such as the C/N ratio characteristic. For example, the capacitance of the first capacitor C31 and the inductance of the line S4 may be three times the capacitance of the second capacitor C42 and the inductance of the second inductor L42, respectively.

Further, the oscillation circuit 30 includes the transistor Q11, the capacitor C6 (third capacitor) and the capacitor C7 (fourth capacitor), which capacitors are connected in series between the base of the transistor Q11 and ground. The node between the capacitors C6 and C7 is connected to the emitter of the transistor Q11. This arrangement forms the Clap oscillator that includes the coupling capacitors C51 and C52 is a Colpitts oscillator.

Further, the resistor R3 is provided between the node between the capacitors C6 and C7 and the emitter of the transistor Q11. When the emitter terminal of the transistor Q11 of the oscillation circuit 30 is used as the output terminal thereof, the transistor Q11 has the collector-grounded (emitter follower) connection. In the collector-grounded connection, the input impedance viewed from the base in the range of high frequencies is inductive, and the output impedance viewed from the emitter is capacitive. In case where the resistor R3 is not provided, an LC resonance may takes place with the base of the transistor Q11, the capacitor C6 and the emitter thereof and may cause abnormal oscillation. Thus, it is preferable to provide the resistor R3 to restrict the abnormal oscillation.

Embodiment 2

Figure 3:
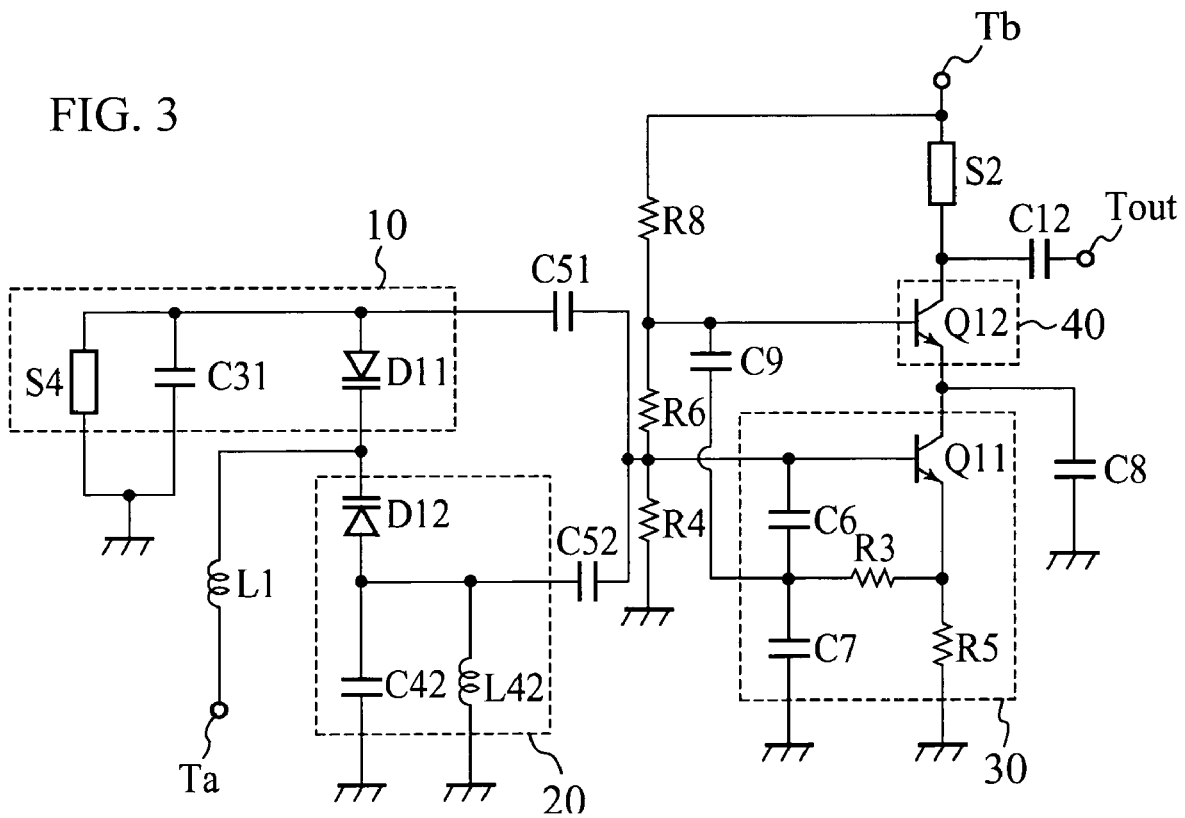
FIG. 3 is a circuit diagram of an oscillator in accordance with a second embodiment.

A second embodiment has an exemplary configuration including a transistor Q12 at a buffer stage. Referring to FIG. 3, an oscillator of the second embodiment is configured by varying the first embodiment so that the NPN bipolar transistor Q12 functioning as the buffer circuit 40 is provided between the collector of the transistor Q11 of the oscillation circuit 30 and line S2. The emitter of the transistor Q12 is connected to the collector of the transistor Q11. The collector of the transistor Q12 is connected to the power supply terminal Tb via the line S2, and is further connected to the output terminal Tout via the capacitor C12. The resistors R8, R6 and R4 divide the power supply voltage into voltages respectively applied to the base of the transistor Q12 and the base of the transistor Q11. The other structures of the second embodiment are the same as those of the first embodiment.

The second embodiment includes the buffer circuit 40 coupled between the collector of the transistor Q11 and the output terminal Tout. It is thus possible to prevent the oscillation circuit from being affected from variations in the impedance of an external circuit connected to the output terminal Tout.

Third Embodiment

Figure 4:
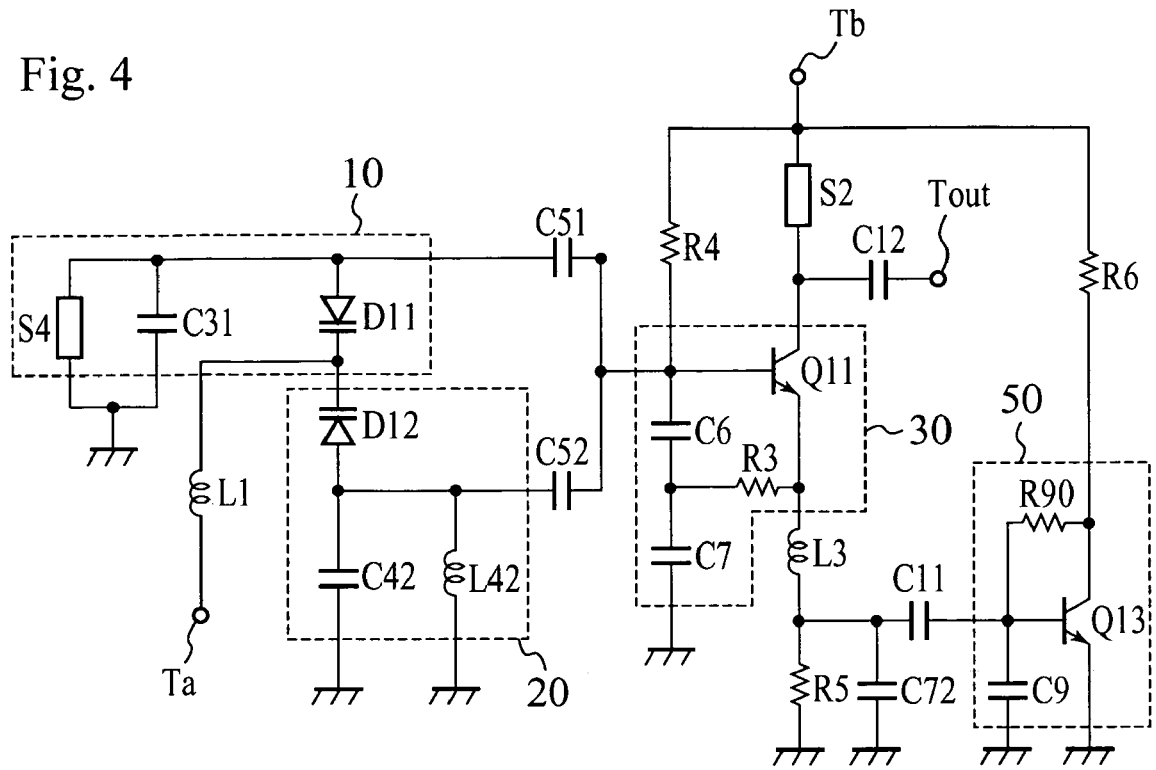
FIG. 4 is a circuit diagram of an oscillator in accordance with a third embodiment.

A third embodiment has an exemplary arrangement including a feedback circuit. Referring to FIG. 4, a feedback circuit 50 is connected to the emitter of the transistor Q11 of the oscillation circuit 30 via an inductor L3. The feedback circuit 50 is connected to the power supply terminal Tb via the resistor R6, and is further connected to the base of the transistor Q11 via the resistor R4.

The feedback circuit 50 includes an NPN bipolar transistor Q13, a capacitor C9 and a resistor R90. The inductor L3 is connected to the base of the transistor Q13 via a coupling capacitor C11. The base f the transistor Q13 is grounded via the feedback capacitor C9. The collector of the transistor Q13 is connected to the resistor R6, and is connected to the base of the transistor Q13 via the resistor R90. The resistor R90 has the function of preventing the collector current from flowing back to the base. The emitter of the transistor Q13 is grounded.

The inductor L3 is grounded via a capacitor C72 and the resistor R5 connected in parallel. The inductor L3 has the function of preventing components of frequencies higher than the resonance frequency from being applied to the emitter of the transistor Q11 from the feedback circuit 50. The resistor R5 has the function of adjusting the power consumption, and the capacitor C72 has the function of adjusting the output level.

The third embodiment includes the feedback circuit 50 connected between the emitter and the base of the transistor Q11 of the oscillation circuit 30. In this manner, the emitter output of the transistor Q11 of the oscillation circuit 30 is fed back to the base of the transistor Q11 due to the function of the feedback circuit 50, so that the C/N ratio can be improved.

Fourth Embodiment

Figure 5:
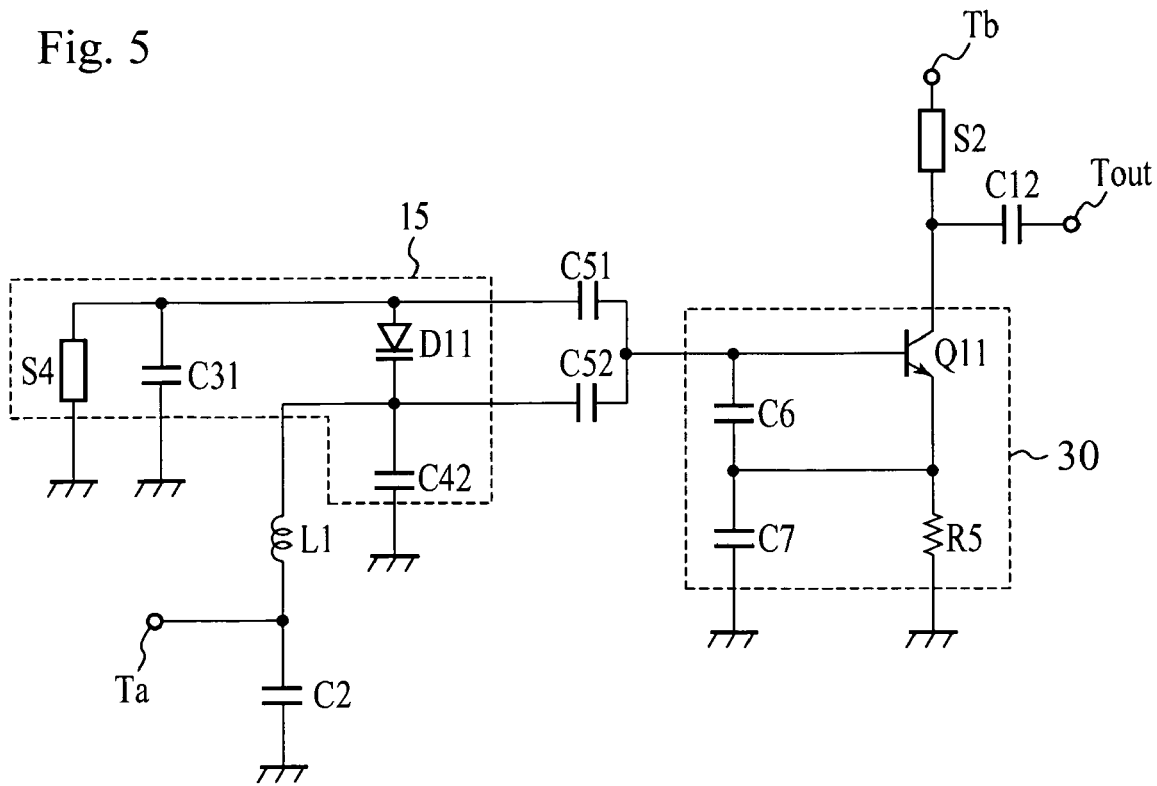
FIG. 5 is a circuit diagram of an oscillator in accordance with a fourth embodiment.

A fourth embodiment has an exemplary configuration in which the resonance circuit and the oscillation circuit are coupled via two coupling capacitors. Referring to FIG. 5, the oscillator of the fourth embodiment includes a resonance circuit 15 and the oscillation circuit 30.

The resonance circuit 15 includes the variable capacitance diode D11, the capacitor C31, the second capacitor C42 and the line S4 (first inductor). The cathode of the variable capacitance diode D11 is connected to the control terminal Ta via the choke inductor L1. The control terminal Ta is grounded via the capacitor C2 for use in removal of high frequency components. The anode of the variable capacitance diode D11 is grounded via the first capacitor C31 and the line S4 connected in parallel. The cathode of the variable capacitance diode D11 is grounded to the second capacitor C42. The control voltage changes the capacitance of the variable capacitance diode D11 of the resonance circuit 15. Thus, the control voltage changes the resonance frequency. The oscillation circuit 30 employed in the present embodiment is the same as that of the first embodiment shown in FIG. 2, and a description thereof will be omitted here.

The base of the transistor Q11 of the oscillation circuit 30 and the anode of the variable capacitance diode D11 of the resonance circuit 15 are coupled to each other via the first coupling capacitor C51. The base of the transistor Q11 and the cathode of the variable capacitance diode D11 are coupled to each other via the second coupling capacitor C52. The oscillation circuit 30 thus configured outputs the oscillation signal of the resonance frequency of the resonance circuit 15 to the collector.

The collector of the transistor Q11 is connected to the power supply terminal Tb via the line S2. The line S2 functions as a choke inductor for supplying the DC voltage to the collector of the transistor Q11. The collector of the transistor Q11 is connected to the output terminal Tout via the capacitor C12. The capacitor C12 has the function of cutting off the DC component and matching impedance. With the above structure, the oscillation signal of the oscillation circuit 30 is output via the output terminal Tout.

According to the fourth embodiment, the resonance frequency of the resonance circuit 15 is primarily defined by the variable capacitance diode D11, and the parallel circuit of the first capacitor C31 and the line S4 (first inductor) connected between the anode of the variable capacitance diode D11 and ground. The second capacitor C42 connected between the cathode of the variable capacitance diode D11 and ground is used to adjust the characteristics such as the C/N ratio.

Further, the oscillator includes the first coupling capacitor C51 via which the resonance circuit 15 and the oscillation circuit 30 are coupled, and the second coupling capacitor C52 via which the resonance circuit 15 and the oscillation circuit 30 are coupled. The first coupling capacitor C51 is connected between the anode of the variable capacitance diode D11 and the base of the transistor Q11. The second coupling capacitor C52 is connected between the cathode of the variable capacitance diode D11 and the base of the transistor Q11. It is thus possible to couple the first capacitor C31 and line S4 of the resonance circuit 15 and the second capacitor C42 with the oscillation circuit 30 with different strengths of coupling.

The capacitance of the first coupling capacitor C51 may be less than that of the second coupling capacitor C52. This weakens the coupling of the first capacitor C31 and the line S4 with the oscillation circuit 30, which coupling primarily defines the resonance frequency. It is thus possible to restrict variations in the resonance frequency of the resonance circuit 15 even if the temperature varies or the external impedance connected to the output terminal Tout varies. Further, the coupling between the second capacitor c42 and the oscillation circuit 30 is strengthened. It is thus possible to easily adjust the C/N ratio by changing the capacitance of the second capacitor C42. This enables the characteristics such as the C/N ratio to be adjusted at the time of designing or producing the oscillators. The capacitance of the first coupling capacitor C51 may be, for example, 1/3 of the capacitance of the second coupling capacitor C52.

Preferably, the capacitance of the first capacitor C31 is greater than that of the second capacitor C42. This makes it possible to primarily define the resonance frequency by the capacitor C32 and the line S4 and to adjust the characteristics such as the C/N ratio by the second capacitor C42. The capacitance of the first capacitor C31 may be as large as three times of the capacitance of the second capacitor C42.

Although a few specific exemplary embodiments employed in the present invention have been shown and described, it would be appreciated by those skilled in the art that changes may be made in these exemplary embodiments without departing from the principles and sprit of the invention, the scope of which is defined in the claims and their equivalents.

What is claimed is:

1. An oscillator comprising:
   a first resonance circuit including a first variable capacitance diode having a cathode connected to a control terminal, a first capacitor and a first inductor directly connected between an anode of the first variable capacitance diode and ground respectively;
   a second resonance circuit including a second variable capacitance diode having a cathode connected to the control terminal, a second capacitor and a second inductor directly connected between an anode of the second variable capacitance diode and ground respectively; and
   an oscillation circuit coupled to the first and second resonance circuits and outputting an oscillation output.

2. The oscillator as claimed in claim 1, wherein the oscillation circuit includes:
   a bipolar transistor; and
   third and fourth capacitors connected in series between the base of the bipolar transistor and ground,
   a node between the third and fourth capacitors being connected to an emitter of the bipolar transistor.

3. The oscillator as claimed in claim 2, further comprising a resistor connected between the node and the emitter.

4. The oscillator as claimed in claim 1, wherein:
   the oscillation circuit has a bipolar transistor;
   the oscillator comprises a buffer circuit coupled between a collector of the bipolar transistor and an output terminal.

5. The oscillator as claimed in claim 1, wherein:
   the oscillation circuit has a bipolar transistor; and
   the oscillator comprises a feedback circuit coupled between an emitter and a base of the bipolar transistor.

6. An oscillator comprising:
   a first resonance circuit including a first variable capacitance diode having a cathode connected to a control terminal, a first capacitor and a first inductor connected between an anode of the first variable capacitance diode and ground;
   a second resonance circuit including a second variable capacitance diode having a cathode connected to the control terminal, a second capacitor and a second inductor connected between an anode of a second variable capacitance diode and ground;
   an oscillation circuit coupled to the first and second resonance circuits and outputting an oscillation output;
   a first coupling capacitor coupling the first resonance circuit and the oscillation circuit; and
   a second coupling capacitor coupling the second resonance circuit and the oscillation circuit,
   wherein the first coupling capacitor and the second coupling capacitor are coupled in parallel.

7. The oscillator as claimed in claim 6, wherein:
   the first coupling capacitor has a capacitance less than that of the second coupling capacitor; and
   the first capacitor and the first inductor have a capacitance and an inductance that are respectively greater than a capacitance of the second capacitor and an inductance of the second inductor.

8. An oscillator comprising:
   a first resonance circuit including a first variable capacitance diode having a cathode connected to a control terminal, a first capacitor and a first inductor connected between an anode of the first variable capacitance diode and ground;
   a second resonance circuit including a second variable capacitance diode having a cathode connected to the control terminal, a second capacitor and a second inductor connected between an anode of a second variable capacitance diode and ground;
   an oscillation circuit coupled to the first and second resonance circuits and outputting an oscillation output;
   a first coupling capacitor coupling the first resonance circuit and the oscillation circuit; and
   a second coupling capacitor coupling the second resonance circuit and the oscillation circuit, wherein:
   the oscillation circuit includes a bipolar transistor;
   the first coupling capacitor is connected between the anode of the first variable capacitance diode and the base of the bipolar transistor; and
   the second coupling capacitor is connected between the anode of the second variable capacitance diode and the base of the bipolar transistor.

9. An oscillator comprising:
   a resonance circuit having a variable capacitance diode having a cathode connected to a control terminal, a first capacitor and a first inductor directly connected between an anode of the variable capacitance diode and ground respectively, and a second capacitor directly connected between a cathode of the variable capacitance diode and ground respectively;
   an oscillation circuit outputting an oscillation signal;
   a first coupling capacitor coupling the resonance circuit and the oscillation circuit; and
   a second coupling capacitor coupling the resonance circuit and the oscillation circuit,
   wherein the first coupling capacitor and the second coupling capacitor are coupled in parallel.

10. The oscillator as claimed in claim 9, wherein the first coupling capacitor has a capacitance less than that of the second coupling capacitor.

11. An oscillator comprising:
    a resonance circuit having a variable capacitance diode having a cathode connected to a control terminal, a first capacitor and a first inductor connected between an anode of the variable capacitance diode and ground, and a second capacitor connected between a cathode of the variable capacitance diode and ground;
    an oscillation circuit outputting an oscillation signal;
    a first coupling capacitor coupling the resonance circuit and the oscillation circuit; and
    a second coupling capacitor coupling the resonance circuit and the oscillation circuit, wherein:
    the oscillation circuit has a bipolar transistor;
    the first coupling capacitor is connected between the anode of the variable capacitance diode and a base of the bipolar transistor; and
    the second coupling capacitor is connected between the cathode of the variable capacitance diode and the base of the bipolar transistor.

* * * * *